(12) United States Patent
Chang et al.

(10) Patent No.: US 6,624,737 B2
(45) Date of Patent: Sep. 23, 2003

(54) VOLTAGE REGULATED CIRCUIT WITH WELL RESISTOR DIVIDER

(75) Inventors: Yao-Wen Chang, Hsin-Chu (TW); Hui-Chih Lin, Taipei (TW); Tao-Cheng Lu, Kaohsiung (TW)

(73) Assignee: Macronix International., Ltd., Hsin-Chu (TW)

( * ) Notice: Subject to any disclaimer, the term of this patent is extended or adjusted under 35 U.S.C. 154(b) by 0 days.

(21) Appl. No.: 10/060,376

(22) Filed: Feb. 1, 2002

(65) Prior Publication Data

US 2003/0146740 A1 Aug. 7, 2003

(51) Int. Cl.[7] .................................................. H01C 7/06
(52) U.S. Cl. ........................................... 338/9; 257/536
(58) Field of Search ............................. 257/536, 27.008, 257/27.047; 338/7, 8, 9

(56) References Cited

U.S. PATENT DOCUMENTS

| | | | | |
|---|---|---|---|---|
| 4,044,371 A | * | 8/1977 | Abdelrahman et al. | ..... 257/467 |
| 5,134,456 A | * | 7/1992 | Kobatake | ..................... 257/536 |

* cited by examiner

*Primary Examiner*—Shawn Riley

(57) ABSTRACT

This invention relates to a voltage regulated circuit, more particularly, to a voltage regulated circuit with a well resistor divider. The present invention applies two well resistors act as the voltage regulated circuit and uses the characteristic of the well resistor in the resistance value, which is increased following the voltage that is transmitted to the well resistor to make an output voltage become a stable value. When the input voltage is an instable and over-high value, the depletion region in the well resistor will extend to absorb the over-high voltage value and make the output voltage to become a stable voltage value.

17 Claims, 5 Drawing Sheets

VOLTAGE REGULATED CIRCUIT WITH WELL RESISTOR DIVIDER

BACKGROUND OF THE INVENTION

1. Field of the Invention

This invention relates to a voltage regulated circuit, more particularly, to a voltage regulated circuit with a well resistor divider. The present invention applies two well resistors act as the voltage regulated circuit to make an output voltage become a stable voltage value.

2. Description of the Prior Art

In the integrated circuits, the voltage regulated circuit is usually in the character of making the output voltage become a stable voltage value to reach the needs of the products. In order to reach the efficiency of the products, the several circuits, which are in the semiconductor circuits, need a stable input voltage to keep their normal proceedings. But the input voltage, which is from the outside, is usually an instable voltage value and varies in a fixed range. This instable voltage value will exert harmful influences to the circuits easily and will further decrease the efficiency and qualities of the integrated circuits. Therefore, the voltage regulated circuit is usually fixed in the integrated circuit, which needs the stable input voltage value, to keep the efficiency of the circuits and to increase the qualities of the integrated circuits.

Most of the voltage regulated circuits are only adjusted following the changes of the input source voltage. But in the inside circuit of the most semiconductor elements, the referred voltage of the circuit will be changed automatically following changes of the source voltage and the temperature. The changes will affect proceedings of several circuits, which need the fixed referred voltage and will further affect qualities of the whole integrated circuit.

SUMMARY OF THE INVENTION

The main objective of the present invention is to make the output voltage become the stable voltage value by using two well resistors act as the voltage regulated circuit.

The second objective of this invention is to increase the qualities and the yields of the integrated circuit by using two well resistors act as the voltage regulated circuit.

The third objective of this invention is to increase the proceeding efficiency of the integrated circuit procedures by using two well resistors act as the voltage regulated circuit.

It is a further objective of this invention to decrease the cost of the integrated circuit by using two well resistors act as the voltage regulated circuit.

In according to the foregoing objectives, the present invention provides a voltage regulated circuit to make the output voltage become the stable voltage value by using two well resistors act as the voltage regulated circuit. When the input voltage, which is transmitted into the voltage regulated circuit, is the instable voltage value, the depletion region, which is in one of the well regions of the well resistor, will extend and the resistance of the well resistor will increase following the increased input voltage. The increased resistance of the well resistor will absorb the over-high input voltage and will make the output voltage to become an expected stable voltage value. Moreover, the voltage regulated circuit of the present invention can be composed by two well resistors whose structure are the same. When the temperature of the environment is different, the depletion region of the two well resistors will vary at the same time to make the output voltage still keep a fixed value and not change following varieties of the temperature. Using the voltage regulated circuit of the present invention will increase the proceeding efficiency of the integrated circuit procedures and will increase the qualities and the yields of the integrated circuits. The present invention will further decrease the cost of the integrated circuits.

BRIEF DESCRIPTION OF THE DRAWINGS

In the accompanying drawing forming a material part of this description, there is shown.

DESCRIPTION OF THE PREFERRED EMBODIMENT

Figure 1:
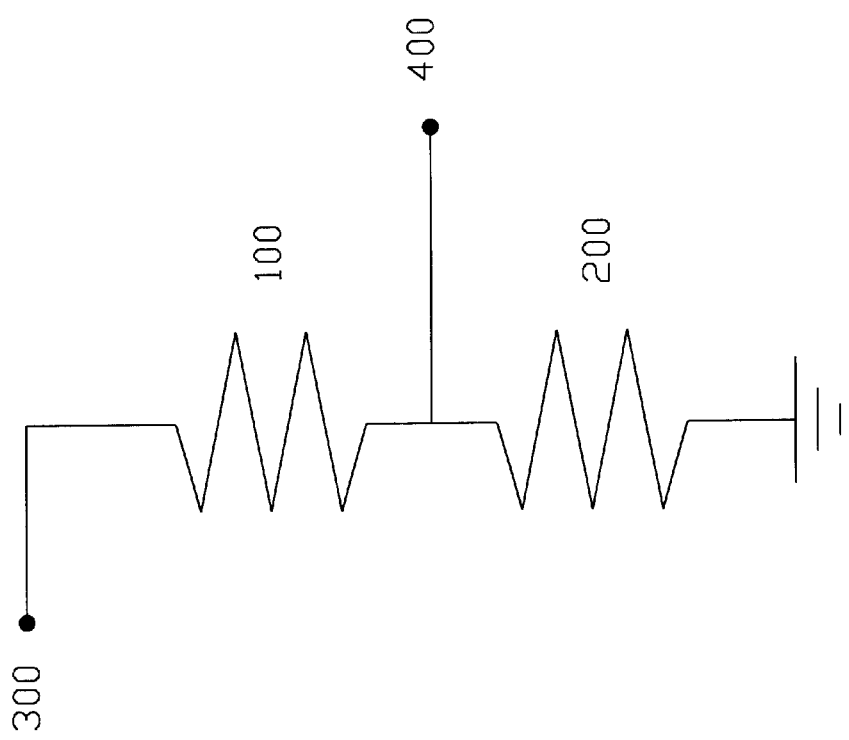
FIG. 1 shows a diagram of the voltage regulated circuit.

The foregoing aspects and many of the attendant advantages of this invention will become more readily appreciated as the same becomes better understood by reference to the following detailed description, when taken in conjunction with the accompanying drawings, wherein:

A voltage regulated circuit is an important circuit in the integrated circuits. Because the voltage regulated circuit can control an output voltage to become a fixed value, several integrated circuits will be kept in the normal operations. When an input voltage is a voltage value whose varied range is fixed, the voltage regulated circuit will absorb the over high input voltage and provide a stable voltage to several circuits Referring to FIG. 1, this shows a diagram of the voltage regulated circuit. The voltage regulated circuit comprises the first resistor 100 and the second resistor 200. One end of the first resistor 100 is connected with one end of the second resistor 200 and the first resistor 100 and the second resistor 200 are in the series condition. A source voltage ($V_{cc}$) 300 is connected with the other end of the first resistor 100 and a referred voltage ($V_{ref}$) 400 is pulled from a place, which is connected with the first resistor 100 and the second resistor 200. The resistance of the first resistor 100 is $R_1$ and the resistance of the second resistor 200 is $R_2$. The other end of the second resistor 200 is connected with a ground. Therefore, the referred voltage 400 is equal to the value, which is got from the source voltage and the ratio of the second resistor's resistance to the total resistance ($R_1+R_2$) to be multiplied together ($V_{ref}=V_{cc}*(R_2/(R_1+R_2))$). If the common resistors are used to be the first resistor 100 and the second resistor 200, the referred voltage 400 value will increase when the source voltage 300 is increased. When the well resistor of the present invention is used to be the first resistor 100, the voltage, which is in the first resistor 100 will be increased and the depletion region of the well resistor will extend to increase the resistance and to deplete the over-high voltage value to make the referred voltage 400 become a stable value when the source voltage 300 is increased.

Figure 2:
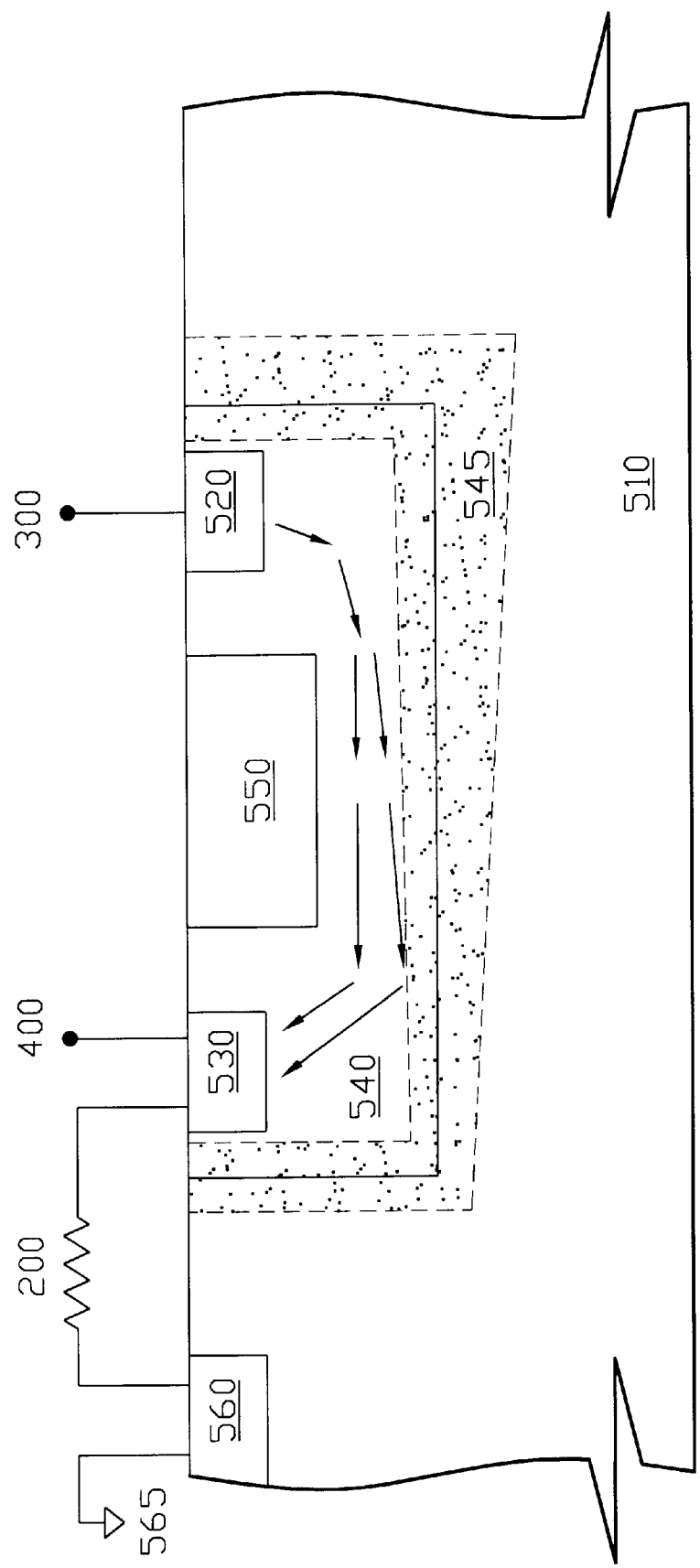
FIG. 2 shows a diagram in using the well resistor to be the first resistor in the semiconductor circuit.

Referring to FIG. 2, this shows a diagram in using the well resistor to be the first resistor. The well resistor is used under the isolation layer. The well resistor is located in a substrate 510 and the substrate 510 comprises the first doped region 520, the second doped region 530, the third doped region 540, the isolation region 550, and the fourth doped region 560. The first doped region 520 and the fourth doped region 560 are divided on the both sides of the second doped region 530. The isolation region 550 is located at the place between the first doped region 520 and the second doped region 530. The isolation region 550 is a shallow trench isolation (STI) region or a field oxide (Fox) region. The first doped region 520, the second doped region 530, and the isolation region 550 are on the third doped region 540. The P-type substrate is usually used to be the material of the substrate 510. The $N^+$ ions are usually implanted into the first doped region 520 and the second doped region 530 to be the first electrode and the second electrode. The N-type ions are usually implanted into the third doped region 540 to be the N-type well resistor. The P-type ions are usually implanted into the fourth doped region 560 to be the third electrode and the third electrode is usually connected with the ground 565. The second electrode and the third electrode are connected by using the second resistor 200. The source voltage 300 is transmitted from the first doped region 520 and the referred voltage is gotten from the second doped region 530. The second resistor 200 is a N-type resistor or a P-type resistor. Following different needs of the circuits, the structure of the second resistor 20 may be as same as the structure of the first resistor 100.

At first, the needed ions are implanted into the first doped region 520, the second doped region 530, the third doped region 540, and the fourth doped region 560 following the needed voltage of the integrated circuits. The depth and the dosage of the ions, which are implanted into the first doped region 520, are 0.1 to 0.5 $\mu$m and $10^{18}$ to $10^{21}$ cubic centimeters (1/cm$^{-3}$). The depth and the dosage of the ions, which are implanted into the second doped region 530, are 0.1 to 0.5 $\mu$m and $10^{18}$ to $10^{21}$ cubic centimeters (1/cm$^{-3}$). The depth and the dosage of the ions, which are implanted into the third doped region 540, are 0.3 to 1 $\mu$m and $10^{15}$ to $10^{18}$ cubic centimeters (1/cm$^{-3}$). The depth and the dosage of the ions, which are implanted into the fourth doped region 560, are 0.1 to 0.5 $\mu$m and $10^{18}$ to $10^{21}$ cubic centimeters (1/cm$^{-3}$).

Figure 3:
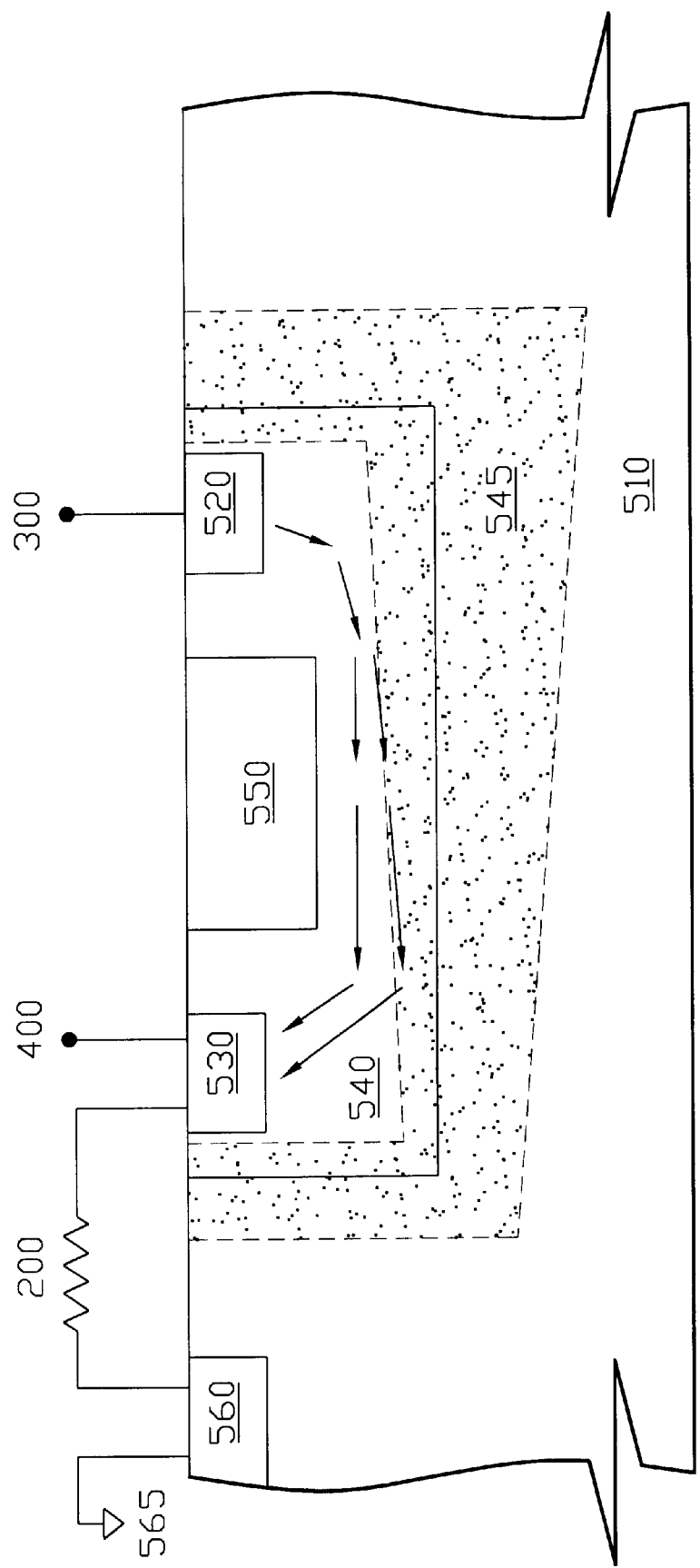
FIG. 3 shows a diagram in transmitting the voltage into the semiconductor circuit, which uses the well resistor to be the first resistor.

When the source voltage 300 transmits a input voltage value into the first doped region 520, the input voltage value will pass through the third doped region 540 and the voltage value of the referred voltage 400 will be gotten from the second doped region 530. When the voltage value of the source voltage is increased suddenly, the ions of the depletion region 545, which is between the third doped region 540 and the substrate 510, will diffuse outside to shrink the quasi-neutral region (referring to FIG. 3). The extended third doped region 540 will increase the resistance of the well resistor and will deplete the over amount of the input voltage value. The stable referred voltage 400 value is still gotten from the second doped region 530. Therefore, the extended depletion region 545 of the third doped region 540 is decided following the input voltage value, which is transmitted into the first doped region 520. When the input voltage value, which is transmitted into the first doped region 520, is higher and higher, the extended region of the third doped region 540 will become bigger and bigger and the resistance of the well resistor will become higher and higher to deplete the over amount input voltage value. If the structure of the second resistor 200 is as same as the structure of the first resistor 100 in the circuit, the depletion region of the two well resistors will vary at the same time to make the output voltage still keep a fixed value and not change following varieties of the temperature when the temperature of the environment is different.

Figure 4:
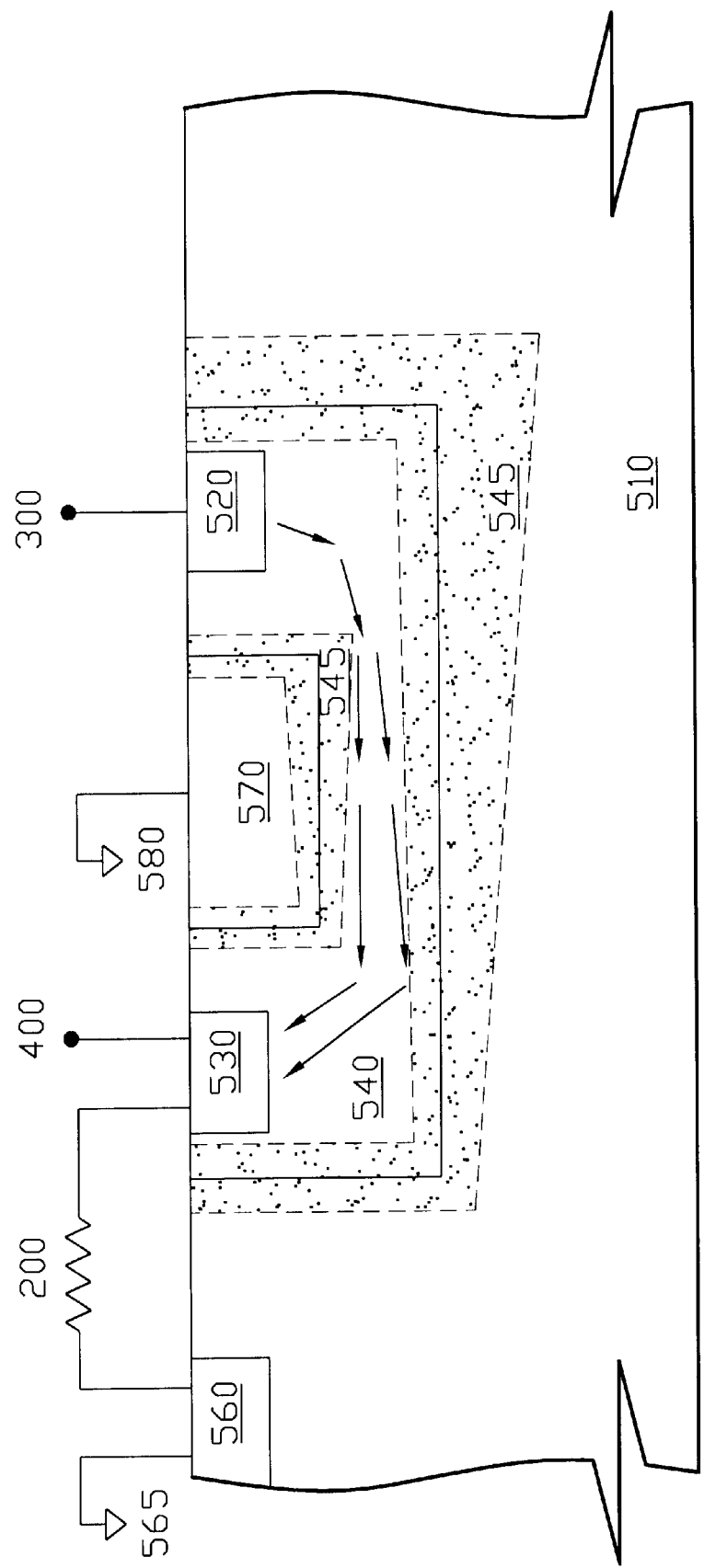
FIG. 4 shows a diagram in using the well resistor to be the first resistor in another semiconductor circuit.

Referring to FIG. 4, this shows a diagram in using the well resistor to be the first resistor in another semiconductor element. The well resistor is located in a substrate 510 and the substrate 510 comprises the first doped region 520, the second doped region 530, the third doped region 540, the fourth doped region 560, and the fifth doped region 570. The first doped region 520 and the fourth doped region 560 are divided on the both sides of the second doped region 530. The fifth doped region 570 is located at the place between the first doped region 520 and the second doped region 530. The first doped region 520, the second doped region 530, and the fifth doped region 570 are on the third doped region 540. The P-type substrate is usually used to be the material of the substrate 510. The $N^+$ ions are usually implanted into the first doped region 520 and the second doped region 530 to be the first electrode and the second electrode. The N-type ions are usually implanted into the third doped region 540 to be the N-type well resistor. The P-type ions are usually implanted into the fourth doped region 560 to be the third electrode and the third electrode is usually connected with the ground 565. The second electrode and the third electrode are connected by using the second resistor 200. The P-type ions are usually implanted into the fifth doped region 570 and the fifth doped region 570 is usually connected with the ground 580. The source voltage 300 is transmitted from the first doped region 520 and the referred voltage is gotten from the second doped region 530. The second resistor 200 is a N-type resistor or a P-type resistor. Following different needs of the circuits, the structure of the second resistor 20 may be as same as the structure of the first resistor 100.

At first, the needed ions are implanted into the first doped region 520, the second doped region 530, the third doped region 540, and the fourth doped region 560 following the needed voltage of the semiconductor elements. The depth and the dosage of the ions, which are implanted into the first doped region 520, are 0.1 to 0.5 $\mu$m and $10^{18}$ to $10^{21}$ cubic centimeters (1/cm$^{-3}$). The depth and the dosage of the ions, which are implanted into the second doped region 530, are 0.1 to 0.5 $\mu$m and $10^{18}$ to $10^{21}$ cubic centimeters (1/cm$^{-3}$). The depth and the dosage of the ions, which are implanted into the third doped region 540, are 0.3 to 1 $\mu$m and $10^{15}$ to $10^{18}$ cubic centimeters (1/cm$^{-3}$). The depth and the dosage of the ions, which are implanted into the fourth doped region 560, are 0.1 to 0.5 $\mu$m and $10^{18}$ to $10^{21}$ cubic centimeters (1/cm$^{-3}$). The depth and the dosage of the ions, which are implanted into the fifth doped region 570, are 0.1 to 0.5 $\mu$m and $10^{18}$ to $10^{21}$ cubic centimeters (1/cm$^{-3}$).

Figure 5:
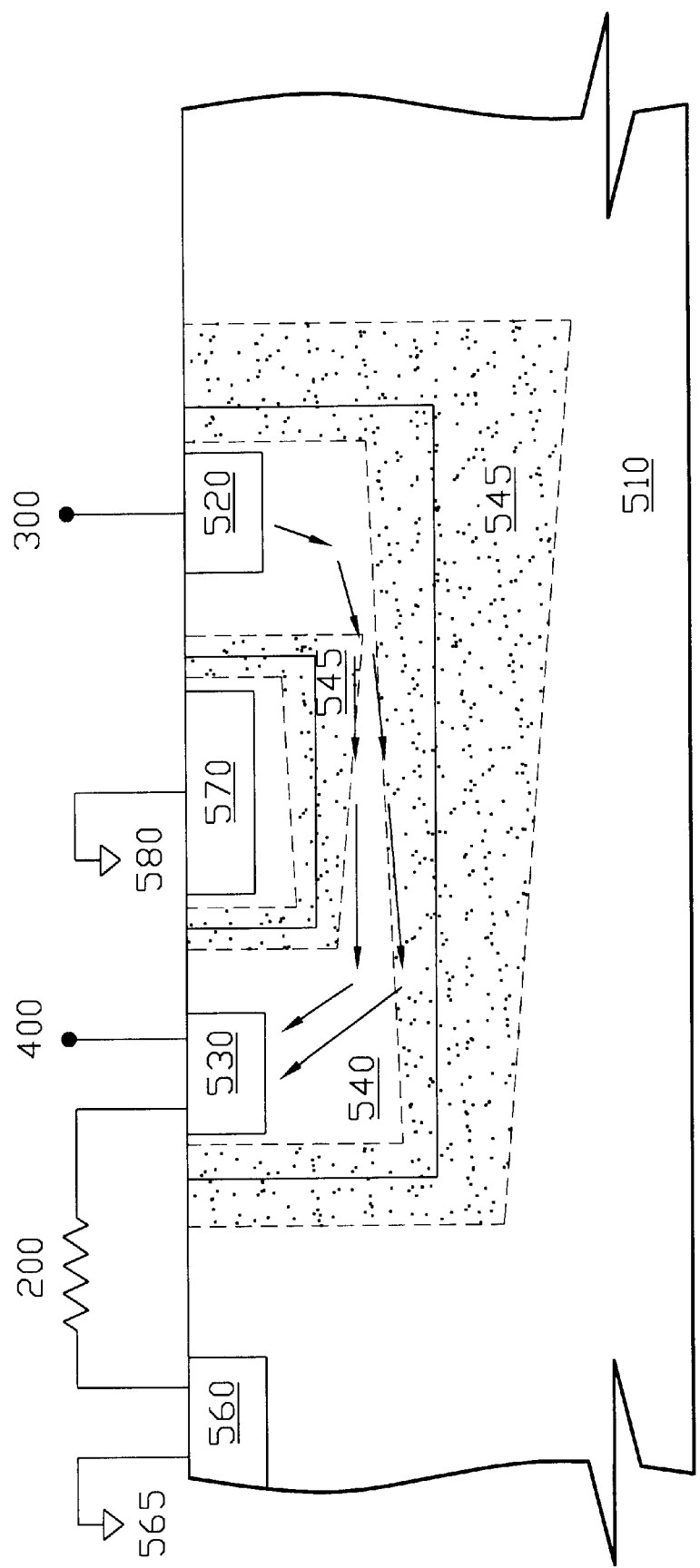
FIG. 5 shows a diagram in transmitting the voltage into another semiconductor circuit, which uses the well resistor to be the first resistor.

When the source voltage 300 transmits a input voltage value into the first doped region 520, the input voltage value will pass through the third doped region 540 and the voltage value of the referred voltage 400 will be gotten from the second doped region 530. When the voltage value of the source voltage 300 is increased suddenly, the depletion region 545, which is in the third doped region 540, will be extended to shrink the quasi-neutral region because of the diffusion of the ions in the third doped region 540 (referring to FIG. 5). The extended depletion region 545, which is in the third doped region 540, will increase the resistance of the well resistor and will deplete the over amount of the input voltage value. The stable referred voltage 400 value is still gotten from the second doped region 530. The extended range of the third doped region 540 is decided following the dosage of the third doped region 540. The extended region of the third doped region 540 is decided following the input voltage value, which is transmitted into the first doped region 520. When the input voltage value, which is transmitted into the first doped region 520, is higher and higher, the extended depletion region 545 of the third doped region 540 will become bigger and bigger and the resistance of the well resistor will become higher and higher to deplete the over amount input voltage value. Because the well resistor just can deplete over amount input voltage by extending the depletion region of the well region, therefore the depth and the dosage of the ions, which are in the third doped region 540, will be decided following the minimum input voltage of the source voltage 300 and the stable voltage value of the referred voltage 400. This condition will make the voltage value of the referred voltage become a stable value and will increase the qualities of the semiconductor products. If the structure of the second resistor 200 is as same as the structure of the first resistor 100 in the circuit, the depletion region of the two well resistors will vary at the same time to make the output voltage still keep a fixed value and not change following varieties of the temperature when the temperature of the environment is different.

Following the different needs of the procedure, the substrate 510 can also use the N-type substrate. When the substrate 510 is the N-type substrate, the ions, which are implanted into the first doped region 520, the second doped region 530, and the third doped region 540, are the $P^+$ ions. The ions, which are implanted into the fourth doped region 560, and the fifth doped region 570, are the $N^+$ ions. Therefore, the well resistor will become the P-type well resistor. Moreover, the first resistor 100 and the second resistor can use the well resistors at the same time to have the same temperature parameter. This condition will make their resistance be changed at the same rate following the changes of the temperature. The output voltage of the voltage regulated circuit will not be changed following the changes of the input voltage and the environment temperature.

In accordance with the present invention, the present invention provides a voltage regulated circuit, which uses a well resistor to be one of the series resistors, to make the output voltage become the stable voltage value. When the input voltage, which is transmitted into the voltage regulated circuit, is the instable voltage value, the depletion region of the well resistor will extend and the resistance of the well resistor will increase following the increased input voltage. The increased resistance of the well resistor will deplete the over-high input voltage and will make the output voltage to become an expected stable voltage value. Using the voltage regulated circuit of the present invention will increase the qualities and the yields of the integrated circuits. The present invention will further decrease the cost of the integrated circuits.

Although specific embodiments have been illustrated and described, it will be obvious to those skilled in the art that various modifications may be made without departing from what is intended to be limited solely by the appended claims.

What is claimed is:

1. A voltage regulated circuit with a well resistor divider, said voltage regulated circuit comprises:
   a first doped region, said first doped region is located in a substrate and said first doped region is connected with a source voltage, wherein said substrate is a P-type substrate;
   a second doped region, said second doped region is located in said substrate and is connected with a referred voltage;
   a third doped region, said third doped region is located in said substrate and contacts to said first doped region and said second doped region;
   when said source voltage is increased suddenly, said third doped region will extend to make said referred voltage become a stable voltage value;
   a isolation region, said isolation region is located between said first doped region and said second doped region in said substrate and is on said third doped region;
   a fourth doped region, said fourth doped region is located in said substrate and is on a side of said second doped region; and
   a resistor, said resistor is connected with said second doped region and said fourth doped region.

2. The voltage regulated circuit according to claim 1, wherein said first doped region is N-type region.

3. The voltage regulated circuit according to claim 1, wherein said second doped region is N-type region.

4. The voltage regulated circuit according to claim 1, wherein said third doped region is N-type well region.

5. The voltage regulated circuit according to claim 1, wherein said fourth doped region is P-type region.

6. The voltage regulated circuit according to claim 1, wherein said isolation region is a shallow trench isolation region.

7. The voltage regulated circuit according to claim 1, wherein said isolation region is a field oxide region.

8. The voltage regulated circuit according to claim 1, wherein said isolation region can be replaced by using a fifth doped region.

9. The voltage regulated circuit according to claim 1, wherein said second resistor is a well resistor.

10. The voltage regulated circuit according to claim 9, wherein said second resistor is a N-type well resistor.

11. The voltage regulated circuit according to claim 9, wherein said second resistor is a P-type well resistor.

12. A voltage regulated circuit with a well resistor divider, said voltage regulated circuit comprises:
   a first doped region, said first doped region is located in a substrate and said first doped region is connected with a source voltage, wherein said substrate is a N-type substrate and said first doped region is a P-type doped region;
   a second doped region, said second doped region is located in said substrate and is connected with a referred voltage, wherein said second doped region is a P-type doped region;
   a third doped region, said third doped region is located in said substrate and contacts to said first doped region and said second doped region, wherein said third doped region is a first well region whose type is P;
   when said source voltage is increased suddenly, said third doped region will extend to make said referred voltage become a stable voltage value;
   a fourth doped region, said fourth doped region is located in said substrate and is on a side of said second doped region, wherein said fourth doped region is a N-type doped region;
   a fifth doped region, said fifth doped region is located between said first doped region and said second doped region in said substrate and is on said third doped region, wherein said fifth doped region is a $N^+$-type doped region and is connected with a ground; and a second well resistor, said second well resistor is connected with said second doped region and said fourth doped region.

13. The voltage regulated circuit according to claim 12, wherein said fifth doped region can be replaced by using a isolation region.

14. The voltage regulated circuit according to claim 12, wherein said isolation region is a shallow trench isolation region.

15. The voltage regulated circuit according to claim 12, wherein said isolation region is a field oxide region.

16. The voltage regulated circuit according to claim 12, wherein said second resistor is a N-type well resistor.

17. The voltage regulated circuit according to claim 12, wherein said second resistor is a P-type well resistor.

* * * * *